US006807214B2

(12) United States Patent
Corzine et al.

(10) Patent No.: US 6,807,214 B2
(45) Date of Patent: Oct. 19, 2004

(54) INTEGRATED LASER AND ELECTRO-ABSORPTION MODULATOR WITH IMPROVED EXTINCTION

(75) Inventors: Scott W. Corzine, Sunnyvale, CA (US); David Bour, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/211,865

(22) Filed: Aug. 1, 2002

(65) Prior Publication Data

US 2004/0022289 A1 Feb. 5, 2004

(51) Int. Cl.[7] .................................................. H01S 5/00

(52) U.S. Cl. ............................................ 372/50; 372/43

(58) Field of Search ...................................... 372/43, 50

(56) References Cited

U.S. PATENT DOCUMENTS 5,363,392 A * 11/1994 Kasukawa et al. ............ 372/45
5,383,211 A * 1/1995 Van de Walle et al. ....... 372/43
5,539,763 A * 7/1996 Takemi et al. ................ 372/50
5,574,289 A * 11/1996 Aoki et al. .................... 257/17
5,889,294 A * 3/1999 Kashima et al. .............. 257/80
6,233,264 B1 * 5/2001 Sato ............................ 372/45
6,330,263 B1 * 12/2001 Garbuzov et al. ............ 372/45
6,339,607 B1 * 1/2002 Jiang et al. .................... 372/50
6,455,338 B1 * 9/2002 Takagi et al. ................. 438/24

* cited by examiner

*Primary Examiner*—David Porta
*Assistant Examiner*—Davienne Monbleau

(57) ABSTRACT

A modulated light emitter having a laser and modulator constructed on a common substrate. The light emitter includes an active layer having a quantum well (QW) layer sandwiched between first and second barrier layers. The active layer includes a laser region and a modulator region connected by a waveguide. The laser region emits light when a potential is applied across the active layer in the laser region. The modulator region has a first state in which the modulator region absorbs the generated light and a second state in which the modulator region transmits the generated light. The modulator region assumes either the first or second state depending on the potential across the modulator region. The QW layer in the modulator region is under a tensile strain, which provides improved light absorption in the first state.

7 Claims, 1 Drawing Sheet

20
30
28
29
25
27
24
18
26
23
22
18
21
19
10

INTEGRATED LASER AND ELECTRO-ABSORPTION MODULATOR WITH IMPROVED EXTINCTION

FIELD OF THE INVENTION

The present invention relates to semiconductor lasers, and more particularly, to lasers that are coupled to light modulators.

BACKGROUND OF THE INVENTION

Communication systems based on modulated light sources are well known to the art. In high-speed communication systems, the light source is typically a laser. At frequencies below 10 GHz, the modulation can be imparted to the light source by turning the laser on and off. Unfortunately, this type of laser modulation leads to increased line width in the laser light. At frequencies at or above approximately 10 Ghz, this increased line width cannot be tolerated.

Accordingly, light sources that are to be modulated at frequencies above 10 GHz are typically constructed by providing a laser that runs continuously and a separate light modulator that modulates the intensity of the laser output. The modulator typically has a transmissive state and an opaque state, which are switched back and forth by applying a potential across the modulator. In one type of light source, the laser and modulator are constructed on a common substrate. The length of the modulator section is preferably as short as possible to maximize the performance of the modulator. However, the length of the modulator must be sufficient to provide the desired contrast between the transmissive and opaque states of the modulator.

Broadly, it is the object of the present invention to provide an improved light source and modulator.

These and other objects of the present invention will become apparent to those skilled in the art from the following detailed description of the invention and the accompanying drawings.

SUMMARY OF THE INVENTION

The present invention is a modulated light emitter having a laser and modulator constructed on a common substrate. The light emitter includes a first contact layer of a first semiconductor type and a first cladding layer on the contact layer of the first semiconductor type. An active layer is constructed on the cladding layer. The active layer includes a quantum well (QW) layer sandwiched between first and second barrier layers. A second cladding layer of the opposite semiconductor type and a second contact layer of the opposite semiconductor type are constructed over the active layer. The active layer includes a laser region and a modulator region connected by a waveguide. The laser region emits light when a potential is applied across the active layer in the laser region. The modulator region has a first state in which the modulator region absorbs the generated light and a second state in which the modulator region transmits the generated light. The modulator region assumes either the first or second state depending on the potential across the modulator region. The QW layer in the modulator region is under a tensile strain, which provides improved light absorption in the first state.

DETAILED DESCRIPTION OF THE INVENTION

Figure 1:
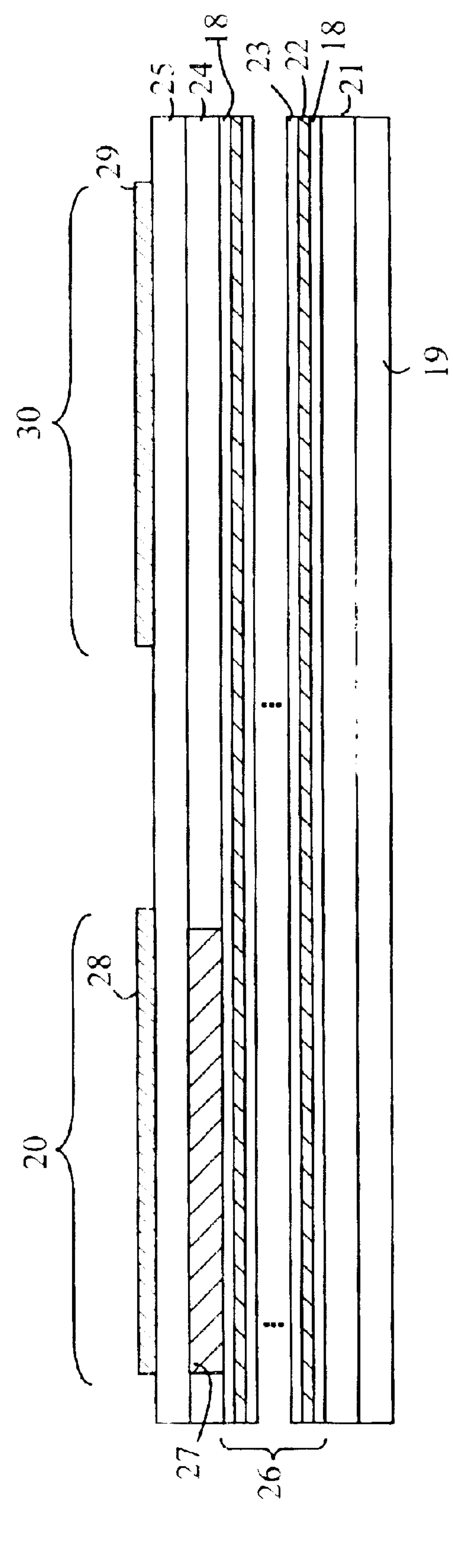
FIG. 1 is a cross-sectional view through a modulated light source 10 consisting of a laser 20 and a modulator 30.

The manner in which the present invention provides its advantages can be more easily understood with reference to an InGaAsP laser and modulator that are constructed on the same substrate. Refer now to FIG. 1, which is a cross-sectional view through a modulated light source 10 consisting of a laser 20 and a modulator 30. Both the laser and modulator are constructed by depositing a number of layers on a suitable substrate that has been omitted from the drawing. The bottom layers typically include an n-type contact layer 19 and a cladding layer 21. An active region 26 is grown on top of cladding layer 21 Layer 26 includes one or more strained quantum well layers 22 separated by barrier layers 23. A confinement layer 18 is typically deposited on each side of the active region. A p-type cladding layer 24 and a p-type contact layer 25 are deposited on the active region. A distributed Bragg reflector 27 sets the wavelength of the laser light in the embodiment shown in FIG. 1. Electrodes 28 and 29 are then deposited on contact layer 25. Laser 20 is powered by providing a potential difference between electrode 28 and contact layer 19. Modulator 30 is switched between a transparent and opaque state by modulating the potential difference between electrode 29 and contact layer 19. The common electrode used to make contact with contact layer 19 has been omitted from the drawing.

Modulator 30 is based on the observation that the quantum well structures will absorb light below a cutoff wavelength whose value depends on the potential across the quantum well layers. The position of the cutoff wavelength is determined by the composition of the quantum well layers. To provide the desired switching function, this cutoff wavelength must move from a value below the wavelength of the laser light generated by laser 20 to a value above the laser wavelength when the potential across the modulator layers is switched.

In indium phosphide lasers, the quantum wells are typically constructed from $In_xGa_{1-x}As_yP_{1-y}$. The relative amount of In and Ga determine the bandgaps of the quantum wells, and hence, the location of the cutoff and the wavelength of the laser light. Higher In concentrations (i.e., greater x values) decrease the bandgap, whereas, higher Ga concentrations increase the bandgap. To provide the proper relationship between the laser wavelength and the modulator cutoff, it can be shown that a structure is required in which the quantum wells in the laser have a higher In concentration than those in the modulator.

A technique known as "selective-area growth" is typically used to shift the bandgap of InGaAsP layers across the device. This technique is based on the observation that indium does not deposit on $SiO_2$. Hence, if the area that is to have an increased In concentration is bounded by $SiO_2$ masks, some of the indium that would have been deposited on the mask area moves into the area between the masks and increases the concentration of indium in that region.

Typically, the base wavelength of the InGaAsP quantum well (QW) active region is adjusted to about 1480 nm. Using masked growth, the indium content and growth rate of InGaAsP QWs is selectively enhanced, resulting in a local wavelength shift to 1550 nm. Subsequently, a laser is fabricated from the selectively-grown 1550 nm QW material, while a modulator is fabricated from the 1480 nm material. The two devices lie along a common waveguide, defined by either a buried heterostructure or ridge waveguide. To simplify the drawings, the waveguide has been omitted.

The maximum attenuation of the modulator in the opaque state depends on the length of the modulator section. In prior art devices, there is a tradeoff in the modulator design between speed and extinction. A high extinction ratio may be achieved by increasing absorption through longer modulators, more quantum wells, or operation with large voltage swings. However, these approaches also compromise the modulation rate. For example, longer modulators translate into greater capacitance, and adding more QWs increases the carrier extraction time. Consequently, it is desirable to maximize the QW absorption without increasing the number of QW layers, so that the modulator can be made as short as possible.

In prior art monolithically integrated laser-modulators, compressively-strained or lattice-matched QWs have been employed in both the modulator and laser sections. A layer is said to be compressively-strained if the "in-plane" lattice constant of that layer (i.e. the lattice constant within the plane of the substrate surface) is less than the lattice constant of the material in bulk. A layer is said to be under tensile strain if the in-plane lattice constant in that layer is greater than the lattice constant of the material in bulk. The strain arises when a layer is deposited on a substrate that has a different bulk lattice constant than that of the layer being deposited. In this situation, the lattice constant of the layer within the plane of the substrate surface is forced to match that of the underlying layer, and hence, the layer is subjected to a stress. The degree of stress is normally specified by specifying the change in the lattice constant. Thus a layer that is under a 1% compressive strain has an in-plane lattice constant that is 1% smaller than the material would exhibit in the bulk state.

The present invention is based on the observation that the extinction ratio in the modulator section would be enhanced by approximately a factor of two if the QWs in that region were in a state of very slight tensile strain rather than the compressive strain utilized in prior art devices.

The optimum tension depends on the thickness of the QW; however, a tension in the range of a few tenths of a percent has been found to be adequate. If the correct amount of tension is applied, the light-hole and heavy-hole valence band edges become degenerate in the modulator region. In this situation, the valence band density of states becomes extremely large, leading to a similarly large enhancement in the direct bandgap absorption or emission. Accordingly, by employing this effect, absorption in a QW modulator may be increased, and the modulator may therefore be made shorter to achieve a given extinction ratio. The reduction in modulator length, in turn, leads to lower capacitance and higher modulator speed.

The level of strain in the QW layers depends on the ratio of In to Ga in the QW layers. The present invention is based on the observation that higher ratios of In to Ga shift the strain in the QW layer to be more compressive. Hence, if the In/Ga ratio in the modulator region is set such that the modulator QW layer is under a small tensile strain, the increased In in the laser region will result in that region having less tensile strain or a compressive strain. The barrier layers that are grown between the QW layers need not be grown with the same strain characteristics as the QW layers. By providing barrier layers that are less strained than the QW layers, the overall strain within the device may be reduced.

For example, a laser/modulator device according to the present invention can be constructed from QW layers of $In_{0.45}Ga_{0.55}As$ that are 8 nm thick separated by 8 nm barrier layers of $In_{0.91}Ga_{0.09}As_{0.39}P_{0.61}$ in the modulator region. The $SiO_2$ masks in the laser section are adjusted in size to provide 10 nm QW layers of $In_{0.49}Ga_{0.51}As$ in the laser region that are separated by 10 nm barrier layers of $In_{0.95}Ga_{0.05}As_{0.39}P_{0.61}$. This arrangement provides a tensile strain of 0.57% in the modulator QW layers and a tensile strain of 0.3% in the laser QW layers. The barrier layers are compressively strained in the two regions. The barrier layers in the modulator region are under a 0.6% compressive strain, and those in the laser region are under a 0.9% compressive strain. This exemplary laser/modulator provides light at a wavelength of approximately 1550 nm. In contrast, a typical prior art laser/modulator for this wavelength utilizes QW layers whose compositions are adjusted to provide a 1% compressive strain in the laser region and a 0.7% compressive strain in the modulator region.

The above-described embodiments of the present invention have utilized a particular material system. However, the present invention may be practiced with any material system in which a slight tensile strain can be incorporated. For example, laser/modulators based on AlGaInAs/InP, AlGaInP/GaAs, GaInAsSb/GaSb, or InGaAsNSb/GaAs can also be constructed utilizing the present invention.

Various modifications to the present invention will become apparent to those skilled in the art from the foregoing description and accompanying drawings. Accordingly, the present invention is to be limited solely by the scope of the following claims.

What is claimed is:

1. A modulated light emitter comprising:

a first contact layer of a first semiconductor type;

a first cladding layer on said contact layer of said first semiconductor type;

an active layer comprising a quantum well (QW) layer sandwiched between first and second barrier layers;

a second cladding layer of the opposite semiconductor type; and a second contact layer of said opposite semiconductor type;

wherein said active layer comprises a laser region and a modulator region, said laser region emitting light when a potential is applied across said active layer in said laser region and said modulator region having a first state in which said modulator region absorbs said generated light and a second state in which said modulator region transmits said generated light, said modulator region assuming either said first or second state depending on the potential across said modulator region, wherein said QW layer in said modulator region is under a tensile strain, and wherein said barrier layers in said modulator region are under less tensile strain than said QW layer.

2. A modulated light emitter comprising:

a first contact layer of a first semiconductor type;

a first cladding layer on said contact layer of said first semiconductor type;

an active layer comprising a quantum well (QW) layer sandwiched between first and second barrier layers;

a second cladding layer of the opposite semiconductor type; and a second contact layer of said opposite semiconductor type;

wherein said active layer comprises a laser region and a modulator region, said laser region emitting light when a potential is applied across said active layer in said laser region and said modulator region having a first state in which said modulator region absorbs said generated light and a second state in which said modulator region transmits said generated light, said modulator region assuming either said first or second state depending on the potential across said modulator region, wherein said QW layer in said modulator region is under a tensile strain, and wherein said barrier layers in said modulator region are under less tensile strain than said QW layer, and, wherein said barrier layers in said modulator region are under a compressive strain.

3. The modulated light emitter of claim 2 wherein said QW layer comprises $In_xGa_{1-x}As_yP_{1-y}$ and wherein x is larger in said larger region than in said modulator region.

4. The modulated light emitter of claim 2 wherein said QW layer comprises AlGaInAs.

5. The modulated light emitter of claim 2 wherein said QW layer comprises AlGaInP.

6. The modulated light emitter of claim 2 wherein said QW layer comprises GaInAsSb.

7. The modulated light emitter of claim 2 wherein said QW layer comprises InGaAsNSb.

* * * * *